US006720267B1

(12) United States Patent
Chen et al.

(10) Patent No.: US 6,720,267 B1
(45) Date of Patent: Apr. 13, 2004

(54) METHOD FOR FORMING A CANTILEVER BEAM MODEL MICRO-ELECTROMECHANICAL SYSTEM

(75) Inventors: Anchor Chen, Ping-Tung (TW); Gary Hong, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 2 days.

(21) Appl. No.: 10/249,149

(22) Filed: Mar. 19, 2003

(51) Int. Cl.⁷ .............................................. H01L 21/311
(52) U.S. Cl. ........................ 438/694; 438/48; 438/52; 438/53
(58) Field of Search ...................... 438/52–53, 459, 438/689–694; 257/415–417

(56) References Cited

U.S. PATENT DOCUMENTS

2003/0116848 A1 * 6/2003 Cunningham et al. ...... 257/747
2003/0119221 A1 * 6/2003 Cunningham et al. ........ 438/52

* cited by examiner

Primary Examiner—Dung Le
(74) Attorney, Agent, or Firm—Winston Hsu (57) ABSTRACT

A cantilever beam type micro-electromechanical system (MEMS) is formed on a substrate. Two first electrodes are formed in a first dielectric layer on the substrate and a waveguide line is formed between the first electrodes. A patterned sacrificial layer and an arm layer are formed on the substrate. Two second electrodes and a second dielectric layer are formed in the arm layer, and an optical grating is formed in the second dielectric layer. Finally, a cap layer is formed on the substrate, and the patterned sacrificial layer is removed.

26 Claims, 13 Drawing Sheets

METHOD FOR FORMING A CANTILEVER BEAM MODEL MICRO-ELECTROMECHANICAL SYSTEM

BACKGROUND OF THE INVENTION

1. Field of the Invention

The present invention relates to a method for forming a micro-electromechanical system (MEMS), and more particularly, to a method for forming a cantilever beam type MEMS applied in the field of fiber-optic communication.

2. Description of the Prior Art

Increasingly popular in Internet applications and rapidly developing in transmission capacity,technologies such as cable modem, asymmetric digital subscriber line (ADSL), and dense wavelength-division multiplexing (DWDM) are proposed to solve network jamming problems. Because DWDM has an advantage of transmitting light with multi-wavelengths in a single fiber optic so as to increase the transmission capacity of the fiber optic, DWDM has become one of the most important fiber-optic communication frames.

The DWDM fiber-optic system includes an optical transceiver, a wavelength multiplexer (MUX), a wavelength demultiplexer (D-MUX), an erbium-doped fiber amplifier (EDFA), an add-drop multiplexer, a dispersion compensation device, a filter, an optical switching router, other optical communication devices, processing circuits, and optical mechanisms. In the field of fiber-optic communication, techniques for forming the DWDM include an optical filter type, a fiber-optic grating type, a fiber-optic coupler type, and a waveguide type. The optical filter utilizes prisms or thin film filters (TFFs), the fiber-optic grating utilizes various kinds of optical gratings, such as a fiber bragg grating (FBG) or an arrayed waveguide grating (AWG), and the fiber-optic coupler utilizes various kinds of interferometers, such as a fabry-perot interferometer or a mach-zehnder, to filter wavelengths and splitting beams of multi-channel in optics.

In actual applications, the low cost fiber-optic coupler only transfers 8 wavelengths and is suitable for local network applications, the fiber-optic grating and the waveguide can transfer 64 wavelengths and above and is suitable for a long-distance communication network, and the optical filter can transfer about within 32 wavelengths. In addition, the TFF has an advantage of thermal stability, but due to standards specifying close confinementof optics, the TFF has low yield, high cost, and can not replace the original filters entirely. However, since the AWG technique utilizes a planar optical waveguide method to couple a demand wavelength, and since the manufacturing processes of the AWG are similar to the ordinary semiconductor processes, the original filters can be replaced by the AWG technique, and the AWG can become enter the main-stream market with the increasing demand of high channels.

This kind of micro-electromechanical system (MEMS) incorporates characteristics in optics, mechanics, and electronics, and is manufactured by ordinary semiconductor processes. Data is transferred and always retained in a beam type during the transmissionprocess in MEMS. That is to say, the data does not have to be transformed to an electrical type, and transformed into a beam-to-beam type. And since adjustable microstructures can be formed by using the micro-electromechanical techniques, the MEMS has received much attention from the fields of fiber-optic communication and wireless radio frequency (RF) communication. Therefore, the MEMS techniques have been applied to form the optical communication devices recently, and the traditional photoelectric switching devices are replaced gradually by the MEMS in an optic-electronic-optic (OEO) transform procedure of the DWDM system.

SUMMARY OF INVENTION

It is therefore a primary objective of the claimed invention to provide a method for forming a cantilever beam type micro-electromechanical system (MEMS).

It is another object of the claimed invention to provide a simplified method for forming a cantilever beam type MEMS to reduce costs.

It is another object of the claimed invention to provide a method for forming a MEMS for being an photoelectric switching device to filter wavelengths or split beams of multi-channel in a field of fiber-optic communication.

According to the preferred embodiment of the claimed invention, the cantilever beam type MEMS is formed on a semiconductor substrate including a heavily doped layer and a first dielectric layer formed on the semiconductor substrate. First, at least two first conductors connected to a surface of the heavily doped layer are formed in the first dielectric layer, and a second dielectric layer not connected to the surface of the heavily doped layer is formed in the first dielectric layer between the first conductors. Then, a patterned sacrificial layer and a third dielectric layer are formed on the substrate, and at least two second conductors and a fourth dielectric layer are formed in the third dielectric layer. Further, a plurality of openings are formed in the fourth dielectric layer, and a cap layer is formed on the substrate. Finally, the patterned sacrificial layer is removed by an isotropic etching process.

In the claimed invention, the cantilever beam type MEMS incorporates the fiber-optic grating type DWDM to filter wavelengths and split beams of multi-channel in the field of fiber-optic communication. And because the MEMS are formed by ordinary semiconductor equipment and ordinary semiconductor processes, the processes are simplified, products can be manufactured on a large scale, and costs can be reduced. In addition, the MEMS has a small size so that the MEMS has a shorter reaction time and needs fewer power to operate it.

These and other objectives of the claimed invention will no doubt become obvious to those of ordinary skill in the art after reading the following detailed description of the preferred embodiment that is illustrated in the various figures and drawings.

DETAILED DESCRIPTION

Figure 4:
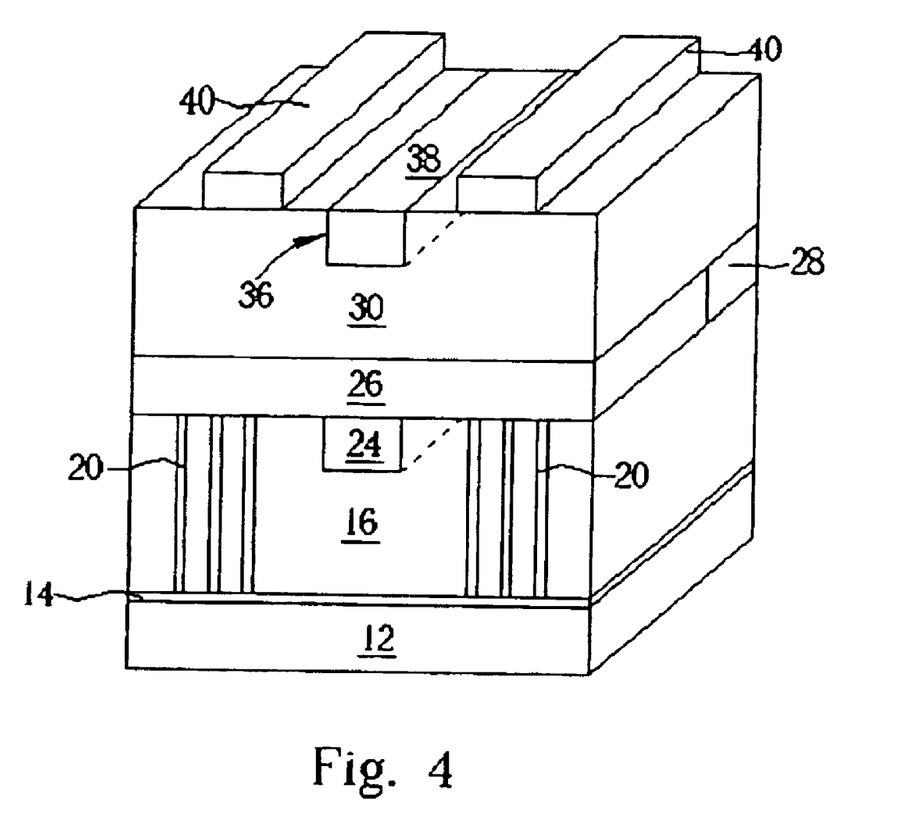
Figure 5:
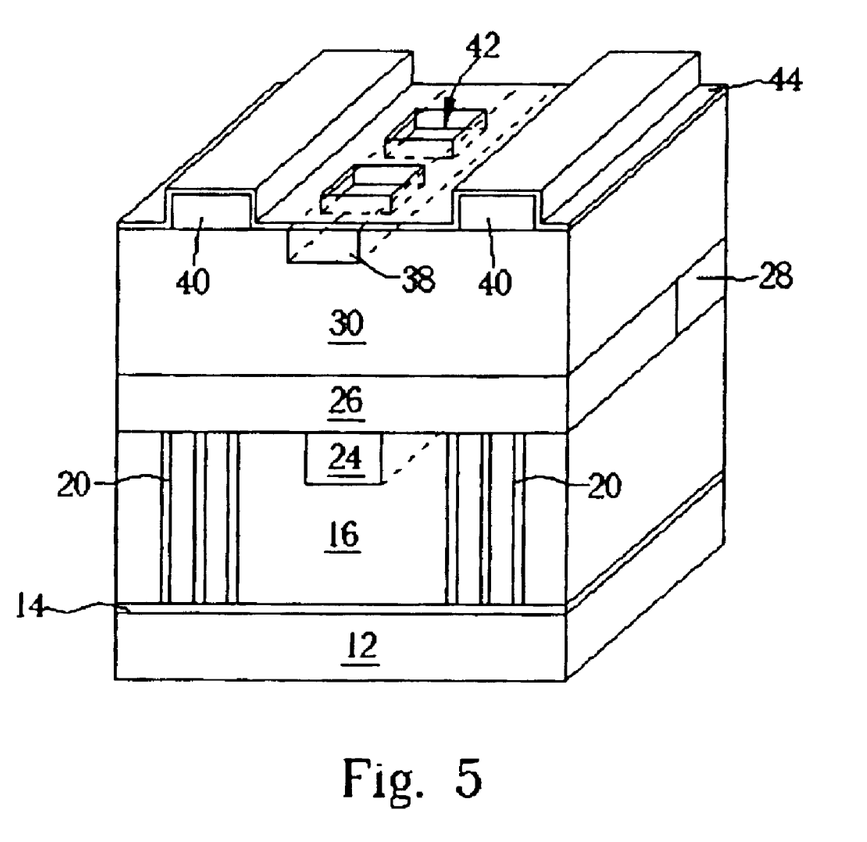

The cantilever beam type micro-electromechanical system (MEMS) of the present invention is formed on an N-type semiconductor substrate. But the present invention is not limited to this, the MEMS of the present invention can be formed on various kinds of substrates, such as a P-type semiconductor substrate, an epitaxial substrate, or a silicon on insulator (SOI) substrate. Please refer to FIG. 1 to FIG. 13, which are schematic diagrams of a method for forming a cantilever beam type MEMS 10 according to the present invention. FIG. 2 is a cross-sectional diagram of the MEMS 10 shown in FIG. 1 along a line I—I. FIG. 4 and FIG. 5 are cross-sectional diagrams of the MEMS 10 shown in FIG. 3 along a line II—II. FIG. 8 is a cross-sectional diagram of the MEMS 10 shown in FIG. 7 along a line III—III.

Figure 1:
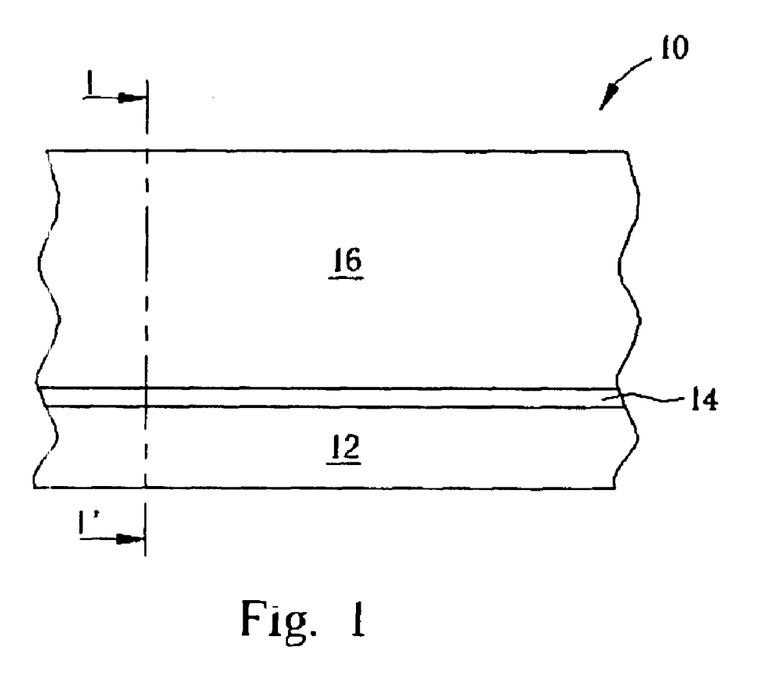
FIG. 1 to FIG. 13 are schematic diagrams of a method for forming a cantilever beam type micro-electromechanical system (MEMS) according to the present invention.
Figure 2:
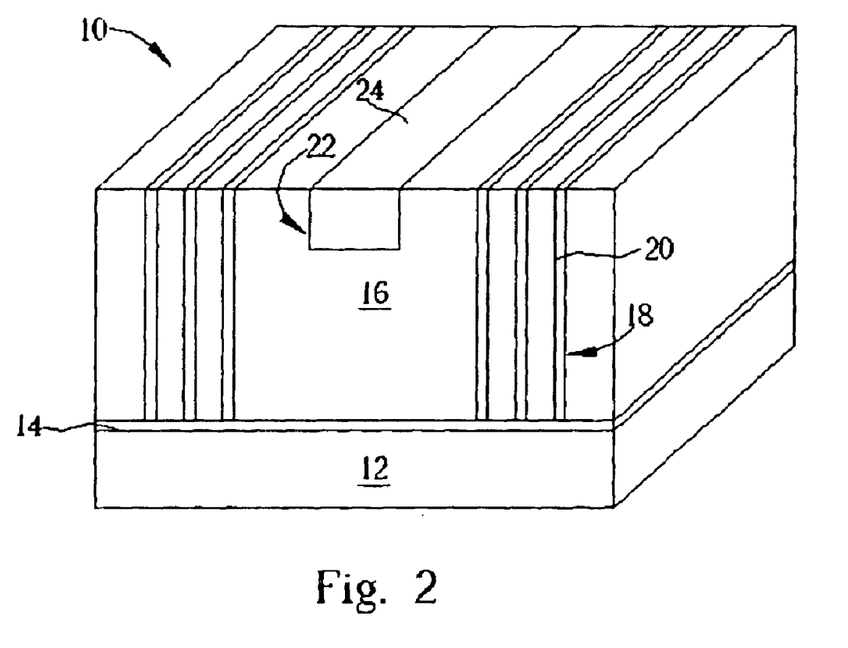

As shown in FIG. 1 and FIG. 2, an ion implantation process is performed to implant phosphor (P) dopants into an N-type semiconductor substrate 12 to form an N-heavily doped layer 14 within the semiconductor substrate 12, and a rapid thermal anneal (RTA) process is performed to repair a surface of the semiconductor substrate 12. Then, a thicker oxide layer 16 is deposited on the heavily doped layer 14, and a photoresist layer (not shown in FIG. 1 and FIG. 2) is coated on the oxide layer 16. A photolithography etching process (PEP) is performed to remove the oxide layer 16 not covered by the photoresist layer to form at least two openings 18 connected to a surface of the heavily doped layer 14 in the oxide layer 16, and the photoresist layer is removed. Further, an N-heavily doped polysilicon layer (not shown in FIG. 1 and FIG. 2) is deposited on the semiconductor substrate 12 and fills the openings 18. A chemical mechanical polishing (CMP) process or an etching back process is performed to remove the polysilicon layer on the oxide layer 16 to form at least two electrodes 20 in the oxide layer 16. After that, another photoresist layer (not shown in FIG. 1 and FIG. 2) is coated on the semiconductor substrate 12, and a PEP process is performed to remove the oxide layer 16 not covered by the photoresist layer to form a trench 22 in the oxide layer 16 not connected to the surface of the heavily doped layer 14. After removing the photoresist layer, an oxide layer (not shown in FIG. 1 and FIG. 2) is deposited on the semiconductor substrate 12 and fills with the trench 22. A CMP process is performed to remove the oxide layer on the electrodes 20 and the oxide layer 16 to form a waveguide line 24 in the oxide layer 16. Typically, a refractive index (RI) of the oxide layer 16 is different from an RI of the waveguide line 24, and the electrodes 20 comprise gold (Au), tungsten (W), copper (Cu), aluminum (Al), Al—Cu alloy, polysilicon, or other conductive materials.

Figure 3:
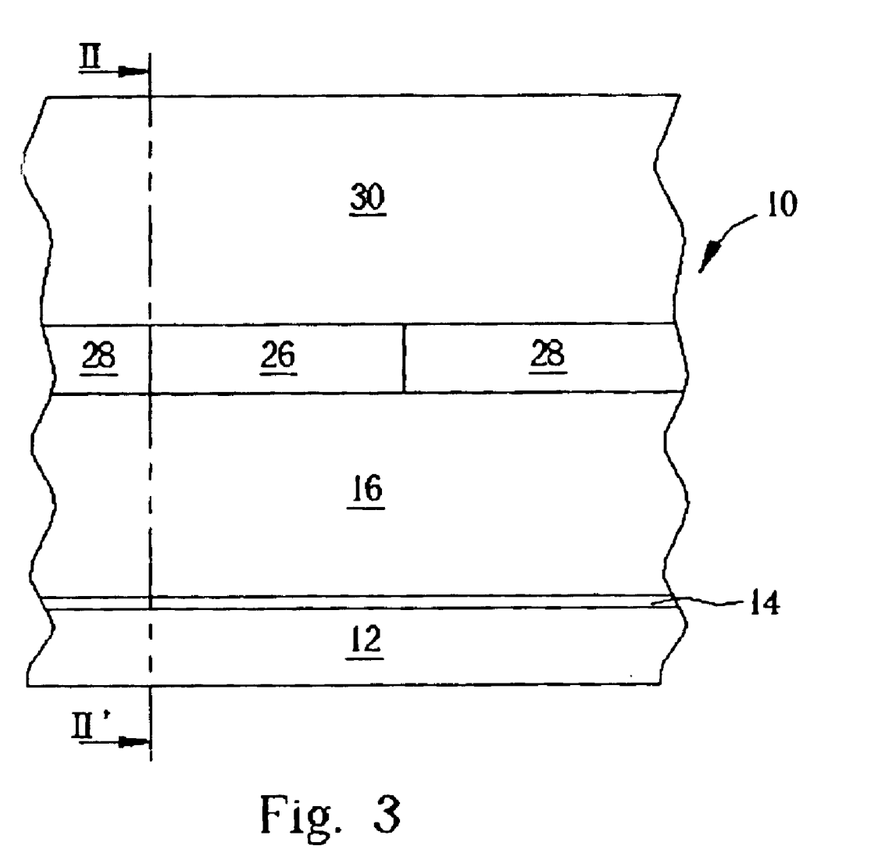

As shown in FIG. 3, a chemical vapor deposition (CVD) process is performed to deposit a sacrificial layer (not shown in FIG. 3) having a thickness of approximately 3 micrometers ($\mu$m) on the semiconductor substrate 12. Typically, the sacrificial layer comprises tungsten (W), silicon nitride, silicon oxide, organic polymer, or porous silicon. Then, a photoresist layer (not shown in FIG. 3) is coated on the sacrificial layer, and a PEP process is performed to remove the sacrificial layer not covered by the photoresist layer to form a patterned sacrificial layer 26. The patterned sacrificial layer 26 covers a portion of the waveguide line 24, the electrodes 20, and the oxide layer 16. After removing the photoresist layer, an oxide layer 28 is deposited on the semiconductor substrate 12, and the oxide layer 28 is thicker than the patterned sacrificial layer 26. A CMP process is performed to make a top surface of the oxide layer 28 substantially aligned with a top surface of the patterned sacrificial layer 26. Therefore, the oxide layer 28 is used as an anchor layer of the cantilever beam type MEMS 10 of the present invention for fixing a follow-up formed microstructure on the semiconductor substrate 12 and preventing the microstructure from damage while removing the patterned sacrificial layer 26 in the subsequent process. Further, an oxide layer 30 having a thickness of approximately 3 $\mu$m is formed on the patterned sacrificial layer 26 and the oxide layer 28.

As shown in FIG. 4, a photoresisit layer (not shown in FIG. 4) is coated on the oxide layer 30 and a PEP process is performed to remove the oxide layer 30 not covered by the photoresist layer to form a trench 36 not connected to a surface of the patterned sacrificial layer 26. Further, a deposition process and a CMP process are performed to fill the trench 36 with an oxide layer 38, and a top surface of the oxide layer 38 is substantially aligned with a top surface of the oxide layer 30. After that, a metal layer having a thickness of approximately 0.8 $\mu$m and a photoresist layer (not shown in FIG. 4) are formed on the oxide layer 30, and a PEP process is performed to remove the metal layer not covered by the photoresisit layer to form at least two electrodes 40. The electrodes 40 are positioned on the oxide layer 30 corresponding to the underlying electrodes 20 formed on two sides of the waveguide line 24. Afterwards, the photoresist layer is removed. Typically, a refractive index (RI) of the oxide layer 30 is different from an RI of the oxide layer 38, and the electrodes 40 comprise gold (Au), tungsten (W), copper (Cu), aluminum (Al), Al—Cu alloy, polysilicon, or other conductive materials.

As shown in FIG. 5, another photoresist layer (not shown in FIG. 5) is formed on the semiconductor substrate 12 and a PEP process is performed to remove the oxide layer 38 not covered by the photoresist layer to form a plurality of openings 42 for being as an optical grating. The openings 42 formed in the oxide layer 38 have equal intervals, equal width, as well as equal depth, and have a depth of approximately 1.5 $\mu$m. Then, a cap layer 44, such as an oxide layer, is formed on the semiconductor substrate 42 and the cap layer 44 covers the openings 42, electrodes 40, the oxide layer 38, and the oxide layer 30.

Figure 6:
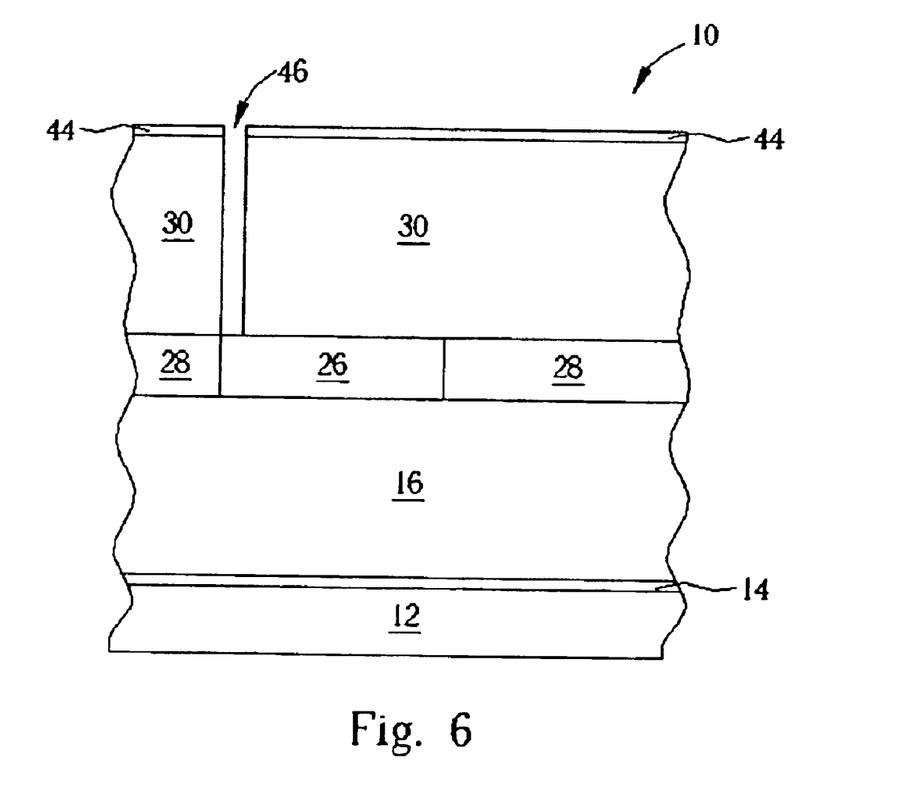
Figure 7:
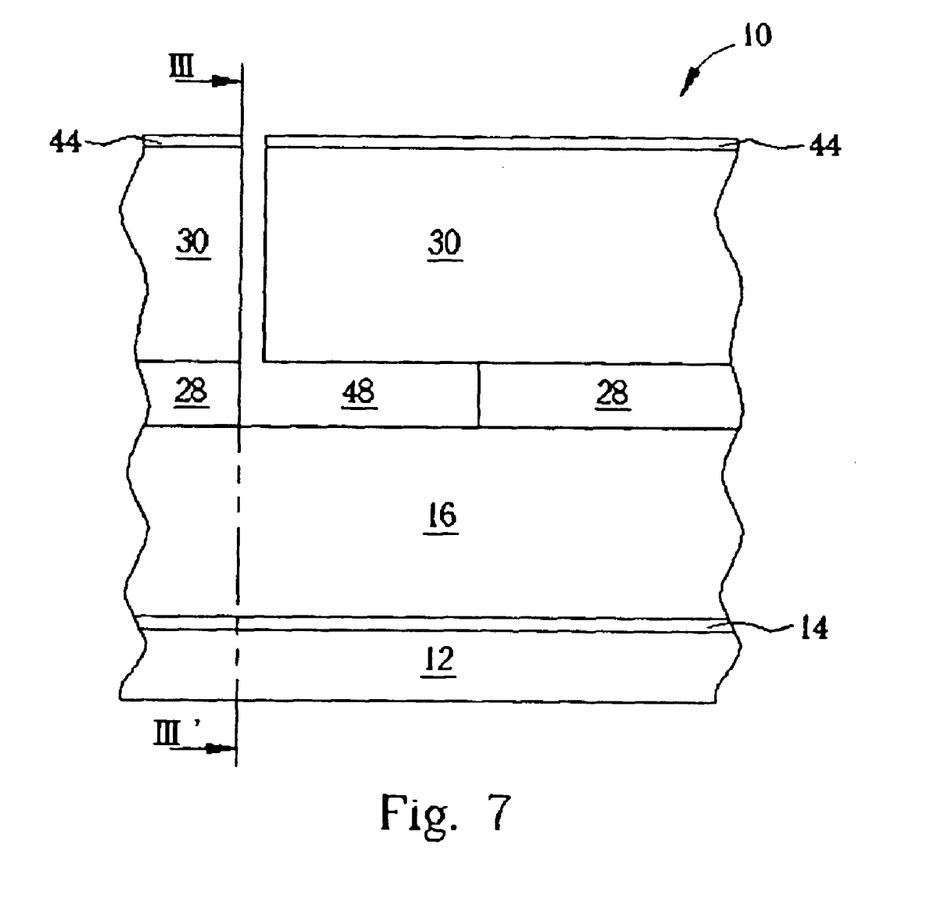
Figure 8:
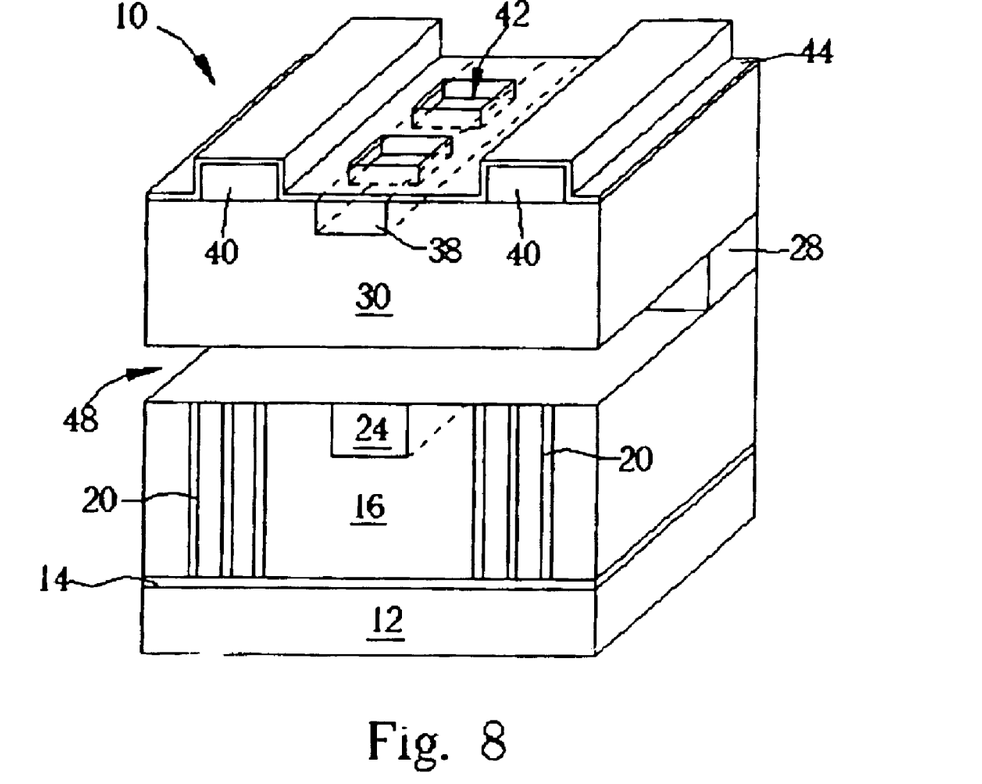

As shown in FIG. 6 and FIG. 7, a patterned photoresist layer (not shown in FIG. 6 and FIG. 7) is formed on the semiconductor substrate 12, and a dry etching process is performed to remove the cap layer 44 and the oxide layer 30 not covered by the patterned photoresist layer to form at least one etching hole 46 in the oxide layer 30. Typically, the number of etch holes 46 depends on size and dimension of the MEMS 10, and a subsequent etching rate. Further, a structure releasing process, such as an isotropic wet etching process is performed. The cantilever beam type MEMS 10 is immersed into an etchant, so that the etchant etches the underlying patterned sacrificial layer 26 laterally, uniformly and rapidly through the etch hole 46 to form a cavity 48, as shown in FIG. 8. The process reduces the etching time substantially and prevents the structure layer from damage of etching or corrosion during removing the patterned sacrificial layer 26. In addition, after performing the wet etching process, a rising and drying process is performed to clean the MEMS 10. In order to prevent surface tension, static electricity, or ionic bonding force of the MEMS from being larger than elastic force of the microstructure, which would cause the microstructure and the semiconductor substrate 12 to stick together and cause the MEMS 10 not to operate, a plurality of bumps (not shown in FIG. 8) can be formed under the oxide layer 30 to reduce contact area between the microstructure and thesemiconductor substrate 12 for preventing the stiction phenomenon.

Figure 9:
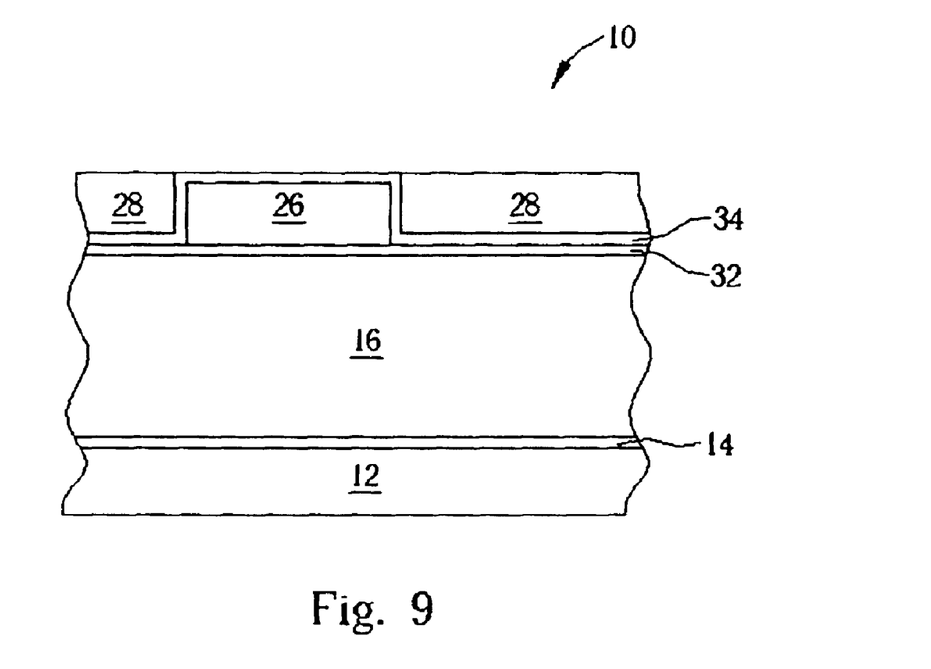
Figure 10:
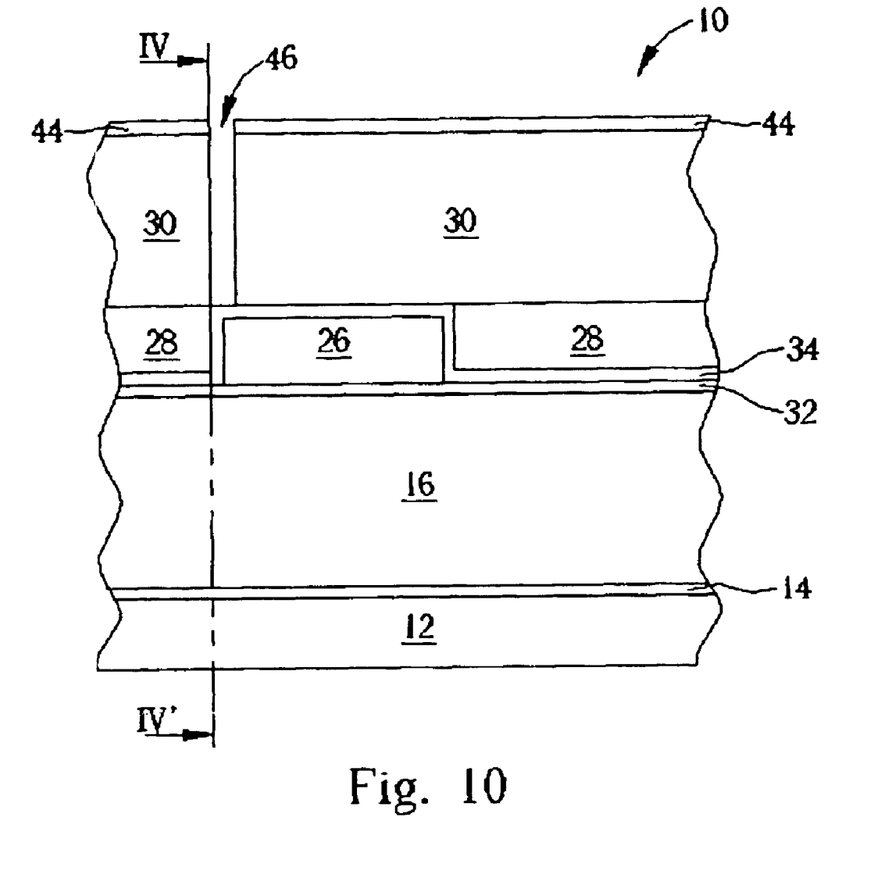
Figure 11:
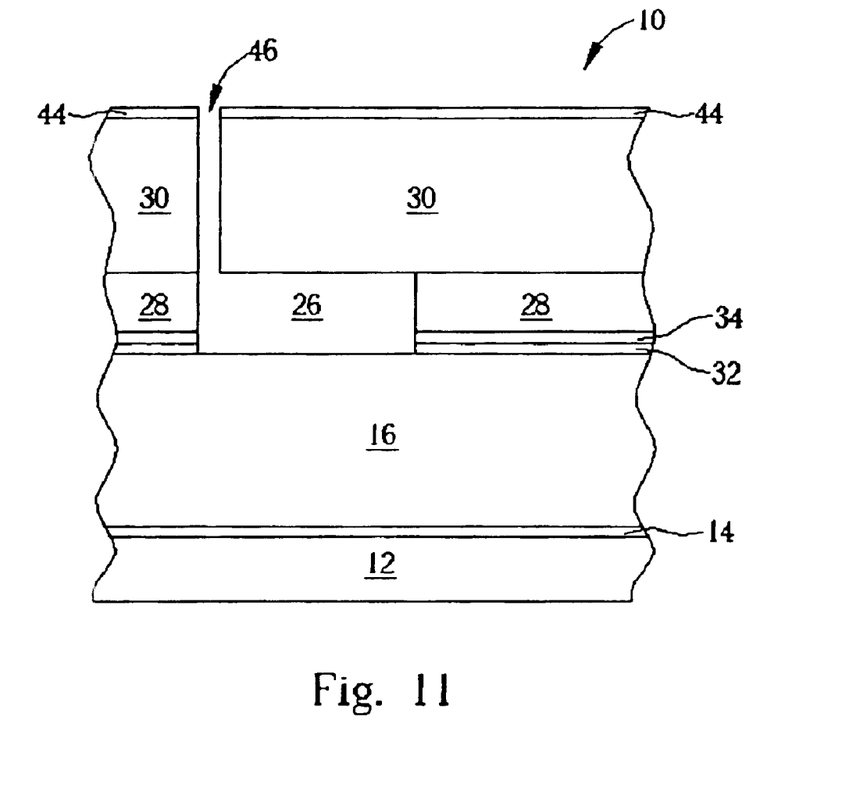

It is worth noticing that a glue layer 32 can be formed on the oxide layer 16 before forming the patterned sacrificial layer 26 of the cantilever beam type MEMS 10 as shown in FIG. 9. The glue layer 32 covers the oxide layer 16, the electrodes 20, and the waveguide line 24 for increasing adhesion property between the patterned sacrificial layer 26 and the oxide layer 16. Furthermore, a block layer 34 can be formed on the oxide layer 16 after forming the patterned sacrificial layer 26 that covers the patterned sacrificial layer 26 for preventing the patterned sacrificial layer 26 from damage in the subsequent process. In addition, one or both of the glue layer 32 and the block layer 34 can be chosen to be formed in accordance with the process demands. Then, the glue layer 32 and the block layer 34 are selectively removed while removing the patterned sacrificial layer 26, as shown in FIG. 10 and FIG. 11.

Figure 12:
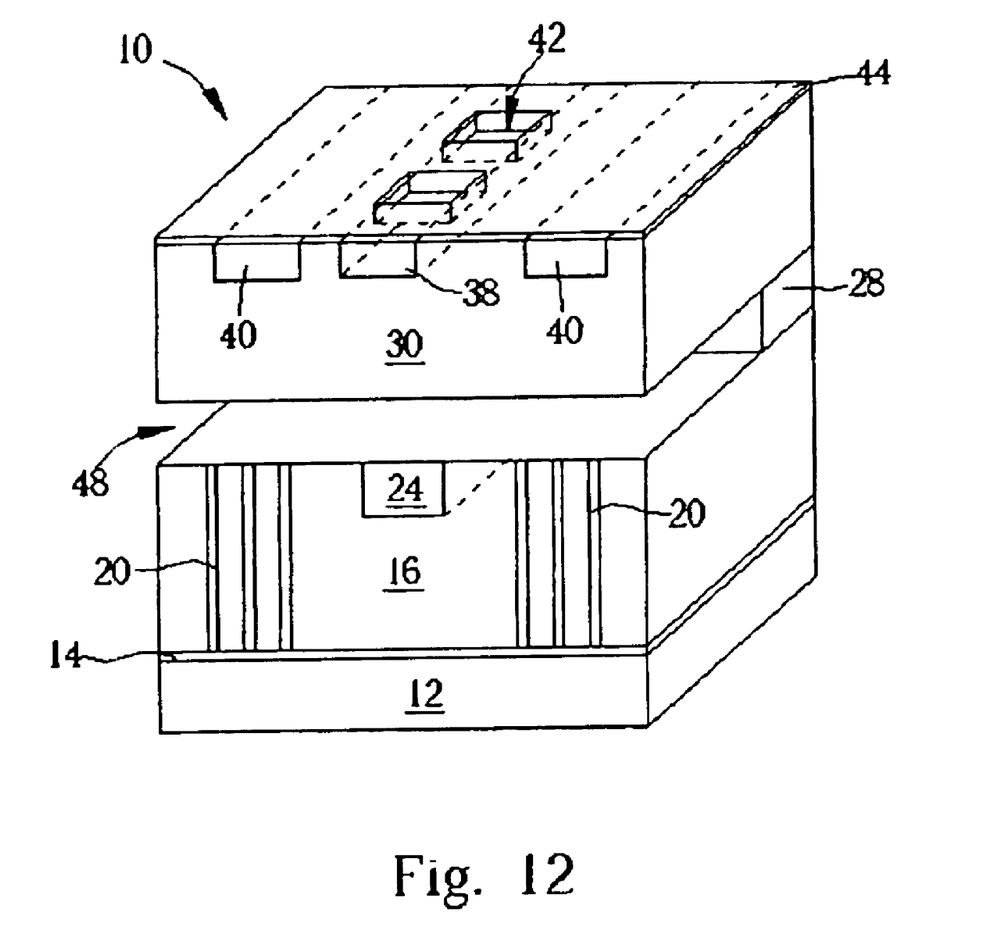

In addition, as shown in FIG. 12, the electrodes 40 of the cantilever beam type MEMS 10 can be formed in the oxide layer 30 before forming the oxide layer 38. The method for forming the electrodes is described below. First, at least two openings (not shown in FIG. 12) not connected to the surface of the patterned sacrificial layer 26 are formed in the oxide layer 30. Then, a conductive layer (not shown in FIG. 12) is deposited on the semiconductor substrate 12 and the conductive layer fills the two openings. A CMP process is performed to make a top surface of the conductive layer substantially aligned with a top surface of the oxide layer 30 to form the two electrodes 40 in the oxide layer 30.

Figure 13:
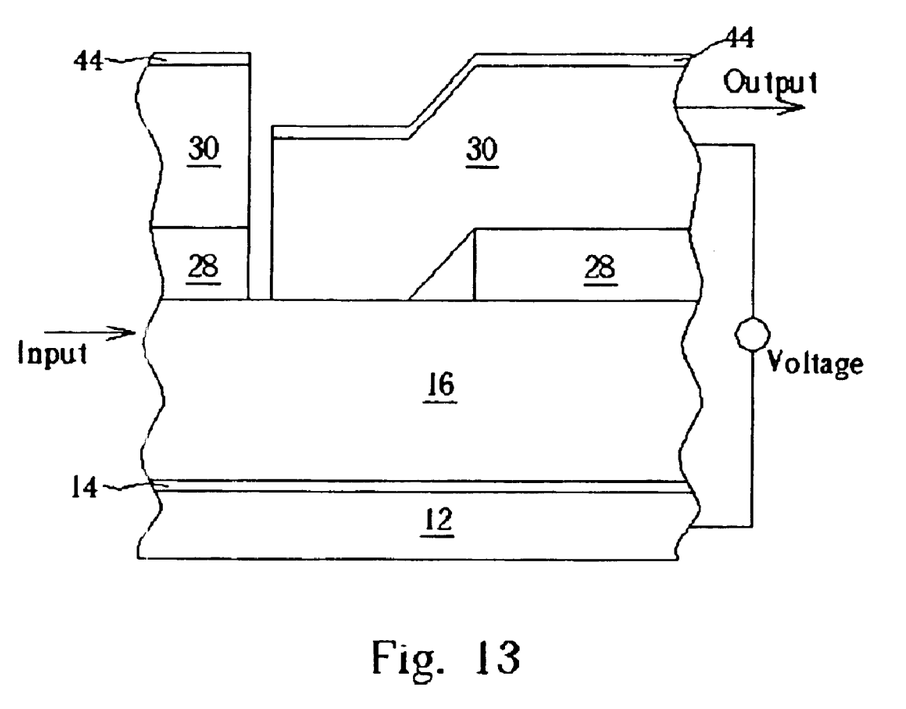

The cantilever beam type MEMS 10 of the present invention is applied in a field of fiber-optic communication for being a photoelectric switching device to filter wavelengths or split beams. Therefore, clamping apparatuses (not shown in Figures) for inputting or outputting optical waves are formed in a forefront of the waveguide line 24. When an optical wave with multi-wavelength conducts into the fiber-optic input terminal of the waveguide line 24, and a voltage, such as 12 volts is applied to the MEMS 10, static electricity is generated to pull close a distance between the electrodes 20 and the electrodes 40, and a height of the cavity 48 is reduced simultaneously as shown in FIG. 13. At this time, due to the waveguide line 24 havinga different RI from the oxide layer 16, the optical wave only transfers forward in the waveguide line 24 locally. When the optical wave reaches the optical grating, the optical wave reflects,in the openings 42 of the optical grating and couples to get a demand wavelength of the optical wave. After that, the optical wave with multi-wavelength returns to the input terminal of the waveguide line 24, and the optical wave with the demand wavelength is outputted additionally, to achieve purposes of filtering wavelengths and splitting beams.

To sum up, the advantages of the cantilever beam type MEMS of the present invention are described below. (1) Since the beam does not have quality and quantity, the MEMS is driven by only little power. (2) For the beam, a tiny displacement (nearly a length of wavelength) can affect the physic phenomenon and characteristics, such as wavelength, intensity and phase, etc, outstandingly. (3) The MEMS has small size so that the MEMS has characteristics of reacting rapidly and moving quickly. (4) The MEMS is packaged easily if the MEMS does not have to contact with environments directly. (5) The MEMS is formed by ordinary semiconductor processes so as to product the MEMS on a large scale with good quality and reduced costs.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for forming a cantilever beam model micro-electromechanical system (MEMS), the method comprising:

providing a semiconductor substrate comprising a heavily doped layer and a first dielectric layer formed within the semiconductor substrate;

forming at least two first conductors connected to a surface of the heavily doped layer in the first dielectric layer;

forming a second dielectric layer not connected to the surface of the heavily doped layer in the first dielectric layer between the first conductors;

forming a patterned sacrificial layer on the semiconductor substrate that covers the second dielectric layer, the first dielectric layer, and the first conductors;

forming a third dielectric layer on the semiconductor substrate that covers the patterned sacrificial layer;

forming a fourth dielectric layer not connected to a surface of the patterned sacrificial layer in the third dielectric layer;

forming at least two second conductors on the third dielectric layer corresponding to the underlying first conductors formed on two sides of the second dielectric layer;

etching the fourth dielectric layer to form a plurality of openings in the fourth dielectric layer;

forming a cap layer on the semiconductor substrate to cover the second conductors, the fourth dielectric layer, and the third dielectric layer; and removing the patterned sacrificial layer.

2. The method of claim 1 further comprising a step of forming a glue layer on the first dielectric layer, the second dielectric layer, and the first conductors before forming the patterned sacrificial layer.

3. The method of claim 2 further comprising a step of removing the glue layer while removing the patterned sacrificial layer.

4. The method of claim 1 further comprising a step of forming a block layer on the patterned sacrificial layer, the first dielectric layer, the second dielectric layer, and the first conductors after forming the patterned sacrificial layer.

5. The method of claim 4 further comprising a step of removing the glue layer while removing the patterned sacrificial layer.

6. The method of claim 1 wherein the third dielectric layer further comprises a first oxide layer and a second oxide layer, and a top surface of the first oxide layer is substantially aligned with a top surface of the patterned sacrificial layer.

7. The method of claim 1 wherein a method of removing the patterned sacrificial layer is an isotropic wet etching process.

8. The method of claim 7 further comprising an etching process to form a plurality of etch holes in the third dielectric layer for removing the patterned sacrificial layer uniformly and rapidly by the wet etching process before removing the patterned sacrificial layer.

9. The method of claim 1 wherein a refractive index (RI) of the first dielectric layer is different from an RI of the second dielectric layer and an RI of the third dielectric layer is different from an RI of the fourth dielectric layer.

10. The method of claim 1 wherein the first conductors and the second conductors both comprise gold (Au), tungsten (W), copper (Cu), aluminum (Al), Al—Cu alloy, polysilicon, or other conductive materials.

11. The method of claim 1 wherein the patterned sacrificial layer comprises tungsten (W), silicon nitride, silicon oxide, organic polymer, or porous silicon.

12. The method of claim 1 wherein the cap layer is an oxide layer.

13. The method of claim 1 wherein the openings formed in the fourth dielectric layer have equal intervals, equal width, as well as equal depth.

14. A method for forming a cantilever beam model micro-electromechanical system (MEMS), the method comprising:

providing a semiconductor substrate comprising a heavily doped layer and a first dielectric layer formed within the semiconductor substrate;

forming at least two electrodes connected to a surface of the heavily doped layer in the first dielectric layer;

forming a waveguide line not connected to the surface of the heavily doped layer in the first dielectric layer between the first electrodes;

forming a patterned sacrificial layer on the semiconductor substrate that covers the waveguide line, the first dielectric layer, and the first electrodes;

forming an arm layer on the semiconductor substrate that covers the patterned sacrificial layer;

forming at least two second electrodes in the arm layer corresponding to the underlying first electrodes formed on two sides of the waveguide line;

forming a second dielectric layer not connected to a surface of the patterned sacrificial layer in the arm layer;

etching the second dielectric layer to form an optical grating in the second dielectric layer;

forming a cap layer on the semiconductor substrate to cover the second electrodes, the second dielectric layer, and the optical grating; and isotropic etching the patterned sacrificial layer to form a cavity under the arm layer.

15. The method of claim 14 further comprising a step of forming a glue layer on the first dielectric layer, the waveguide line and the first electrodes before forming the patterned sacrificial layer.

16. The method of claim 15 further comprising a step of removing the glue layer while removing the patterned sacrificial layer.

17. The method of claim 14 further comprising a step of forming a block layer on the patterned sacrificial layer, the first dielectric layer, the waveguide line, and the first electrodes after forming the patterned sacrificial layer.

18. The method of claim 17 further comprising a step of removing the block layer while removing the patterned sacrificial layer.

19. The method of claim 14 wherein the arm layer further comprises an anchor layer and an oxide layer, and wherein a top surface of the anchor layer is substantially aligned with a top surface of the patterned sacrificial layer, and the oxide layer covers the patterned sacrificial layer and the anchor layer.

20. The method of claim 14 wherein the waveguide line, the arm layer, and the top layer are all made of oxide.

21. The method of claim 14 wherein a refractive index (RI) of the first dielectric layer is different from an RI of the waveguide line and an RI of the second dielectric layer is different from an RI of the arm layer.

22. The method of claim 14 wherein the first electrodes and the second electrodes both comprise gold (Au), tungsten (W), copper (Cu), aluminum (Al), Al—Cu alloy, polysilicon, or other conductive materials.

23. The method of claim 14 wherein the patterned sacrificial layer comprises tungsten (W), silicon nitride, silicon oxide, organic polymer, or porous silicon.

24. The method of claim 14 wherein the optical grating further comprises a plurality of openings with equal intervals, equal width as well as equal depth, and the openings do not connect to the patterned sacrificial layer.

25. The method of claim 14 wherein the method of etching the patterned sacrificial layer is an isotropic wet etching process.

26. The method of claim 25 further comprising a dry etching process to form a plurality of etch holes for removing the patterned layer uniformly and rapidly before etching the patterned sacrificial layer.

* * * * *